US006339116B1

(12) United States Patent
Afzali-Ardakani et al.

(10) Patent No.: US 6,339,116 B1
(45) Date of Patent: Jan. 15, 2002

(54) METHODS OF FABRICATING CROSS-LINKED BIOBASED MATERIALS AND STRUCTURES FABRICATED THEREWITH

(75) Inventors: Ali Afzali-Ardakani, Yorktown Heights, NY (US); Jeffrey Donald Gelorme, Plainville, CT (US); Laura Louise Kosbar, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/770,212

(22) Filed: Dec. 19, 1996

Related U.S. Application Data

(63) Continuation of application No. 08/529,849, filed on Sep. 18, 1995, now abandoned.

(51) Int. Cl.⁷ .......................... C08G 59/00; C08L 97/00
(52) U.S. Cl. ........................ 524/72; 524/73; 524/78; 524/799; 525/534; 527/105; 527/300; 527/305; 527/400; 527/401; 527/601; 523/447; 523/448
(58) Field of Search ...................... 524/72, 73, 799, 524/78; 525/534; 527/401, 400, 105, 300, 305, 601; 523/447, 448

(56) References Cited

U.S. PATENT DOCUMENTS

| | | | | |
|---|---|---|---|---|
| 3,003,978 A | * | 10/1961 | Coney et al. | 523/448 |
| 3,093,604 A | * | 6/1963 | Ayers | 524/73 |
| 3,149,085 A | * | 9/1964 | Ball et al. | 527/401 |
| 3,984,363 A | * | 10/1976 | D'Alelio | 527/400 |
| 4,131,573 A | * | 12/1978 | Brown | 527/401 |
| 4,657,948 A | * | 4/1987 | Roark et al. | 524/73 |
| 4,769,434 A | | 9/1988 | Van der Klashorst et al. | 527/400 |
| 4,868,059 A | * | 9/1989 | Walker et al. | 528/94 |
| 4,931,528 A | * | 6/1990 | Waddill et al. | 528/94 |
| 5,432,213 A | * | 7/1995 | Kim et al. | 524/72 |

FOREIGN PATENT DOCUMENTS

GB        2 281 709        3/1995

OTHER PUBLICATIONS

"Bio–Based Resins for the Manufacture of Printed Wiring Boards", L.L. Kosbar and J. Gelorme, Annu. Tech. Conf. Soc. Plast. Eng. (54th), vol. 2, May 1996, pp. 1378–1381.

* cited by examiner

Primary Examiner—Andrew E.C. Merriam
(74) Attorney, Agent, or Firm—Thomas A. Beck

(57) ABSTRACT

Biobased cross-linked compositions, methods of fabrication and structures, in particular biobased printed wiring boards using the compositions and methods of making the structures are described. Biobased materials such as lignin, crop oils, wood resins, tannins, and polysaccharides and combinations thereof are cross-linked, preferably using heat, a cross-linking agent, and an initiator. The materials fabricated have suitable properties for printed wiring boards which are made by impregnating a fiberglass or biobased cloth with an admixture of the biobased material, cross-linking agent and initiator which is processed by conventional methods to produce a printed wiring board.

5 Claims, 5 Drawing Sheets

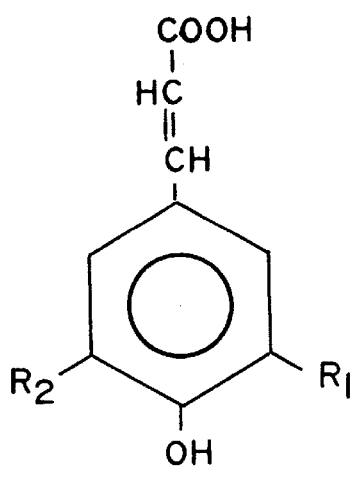
FIG.1
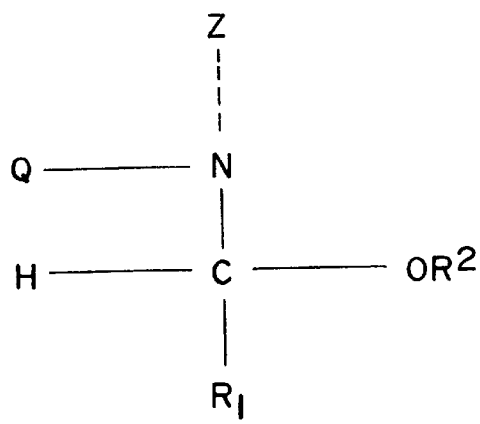
FIG.3
FIG.4
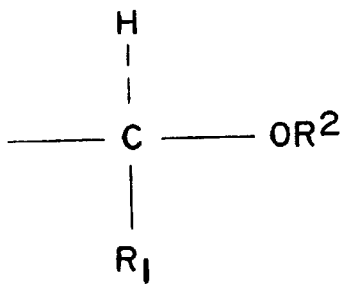
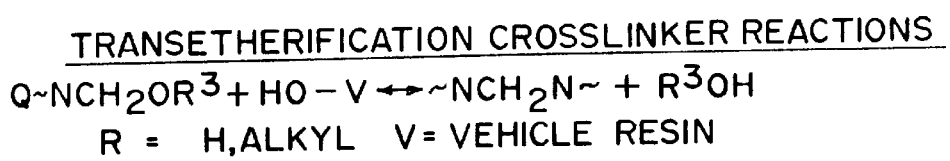
FIG.12
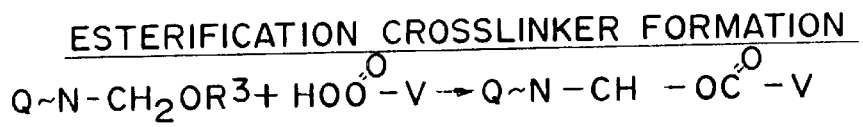
FIG.13

UREA-FORMALDEHYDE POLYMERS

MELAMINE FORMALDEHYDE POLYMERS

BENZOGUANAMINE FORMALDEHYDE POLYMERS

GLYCOLURIL FORMALDEHYDE CROSSLINKING AGENTS

METHODS OF FABRICATING CROSS-LINKED BIOBASED MATERIALS AND STRUCTURES FABRICATED THEREWITH

CROSS-REFERENCES TO RELATED APPLICATIONS

This is a continuation of application Ser. No. 08/529,849, filed Sep. 18, 1995.

U.S. application Ser. No. 08/528,889, entitled Cross-Linked Biobased Materials and Uses Thereof, filed on the same day herewith to Afzali et al., the teaching of which is incorporated herein by reference.

U.S. application Ser. No. 08/529,932, entitled Structures Fabricated with Cross-Linked Biobased Materials, filed on the same day herewith to Afzali et al., the teaching of which is incorporated herein by reference.

FIELD OF THE INVENTION

The present invention is directed to methods of fabricating biobased materials and structures fabricated therewith, in particular to methods of fabricating printed wiring boards.

BACKGROUND

With the pervasive use of computers and work stations for personal and business applications, as well as the increasing level of intelligence being built into consumer appliances and automobiles, the volume of printed wiring boards, (PWBs) fabricated and assembled into such systems is likely to increase at a rapid rate for the foreseeable future. This trend, compounded by the short time span between successive generations of technological advances in these products and the associated obsolescence of older products, leads to a potentially significant problem of disposing of the PWBs in these products. The problem stems from the type of materials used in the manufacturing of the PWB composites. Traditionally, the PWBs are made of layers of thin sheets of thermosetting epoxy resins which are applied on to a woven fabric or a random dispersion of high modulus organic (carbon or aramid) or inorganic (glass) fibers. These laminates can be drilled, metallized and patterned to create vias and interconnection wiring. The individual layers are then laminated together and rigidified, or cured, by thermal and/or chemical means to achieve the final shape and desired electrical and mechanical characteristics, these composite laminates then become active circuit boards when electronic components are attached to them by lead containing solders. The amount of PWBs manufactured in this way is substantial: according to a 1989 report prepared by the Technology Marketing Research Council (T/MRC) of the IPC (Institute for Interconnection and Packaging of Electrical Circuits), PWB manufacturing activities worldwide consumed 1655 million square ft. of rigid laminate. The volume for North American usage alone was 282 million square ft. The PWBs manufactured in 1989 will be obsolete eventually and will need to be disposed of as solid waste. The European Community has recently mandated a "take-back" policy that forces acceptance of any and all returned items to the manufacturer specifically for recycling. Such regulations are likely to arise worldwide which will further exacerbate the laminate disposal problem and shift it to the manufacturing countries such as the U.S. Such PWB composites cannot be directly disposed in a landfill however, because of the space filling and non-degradable nature of their make up. Therefore, PWBs are generally ground up and incinerated first to reduce landfill volume. Some manufactures of PWBs voluntarily accept trade-ins of old equipment in exchange for new equipment purchases and incinerate the old PWBs. Although incineration is a form of recycling in that some energy is recovered, operation of incinerators with the appropriate scrubbers to ensure that emissions into the atmosphere are free of pollutants is expensive. Further, the process still generates 30% by weight of residual ash which in turn has to be handled, shipped and disposed of as toxic waste in a designated landfill, particularly because it contains metals like lead. The inorganic fibers used in PWBs are not toxic but they are not accessible to recycling in the composite form, thus contributing to the ash volume. An environmentally compatible solution to the problem, we believe, has to begin by focusing on seeking out reinforcing resinous materials, as well as interconnection and assembly materials that are by choice based on renewable resources, that are non-toxic and yet meet the performance demands of the electronic applications on hand. Further, it is desirable to seek options that, when possible, reduce or eliminate the use of environmentally unacceptable chemicals and solvents and consume less energy to manufacture thus providing cost and further ecological advantages.

It is an object of the present invention to substitute the resins and fibers currently used with bio-based materials. Bio-based materials are defined as materials derived from renewable resources by chemical or mechanical means or products derived from biological sources.

It is another object of the present invention to provide reinforced composites, and methods of fabrication thereof using biobased renewable resources for manufacture of printed wiring boards (PWB) that meet or exceed the thermal, mechanical and electrical performance requirements of FR-4 (epoxy based) grade laminates.

It is another object of the present invention to produce PWBs that are comparable in performance to those currently used and yet, at the end of their service life be amenable to waste treatment at least partially by biodegradability.

It is another object of the present invention to replace the petroleum based epoxies currently used in the manufacture of printed circuit cards (such as FR-4) with biobased materials.

SUMMARY OF THE INVENTION

A broad aspect of the present invention is a method of fabricating a cross-linked polymer selected from the group of lignin, crop oils, wood resins, tannins, polysaccharide resins and combinations thereof.

A more particular aspect of the present invention is a method of fabricating a printed circuit board from the cross-linked polymers according to the present invention.

BRIEF DESCRIPTION OF THE DRAWINGS

Further objects, features, and advantages of the present invention will become apparent from a consideration of the following detailed description of the invention when read in conjunction with the drawing and FIGS, in which:

FIG. 1 is a monomer from which lignin is formed.

FIG. 3 schematically shows an amino-aldehyde cross-linking agent according to the present invention.

FIG. 4 shows an aldehyde group for Z of FIG. 3.

FIG. 12 shows transetherification amino cross-linker reactions.

FIG. 13 shows estherification amino cross-linker reactions.

DETAILED DESCRIPTION

Figure 2:
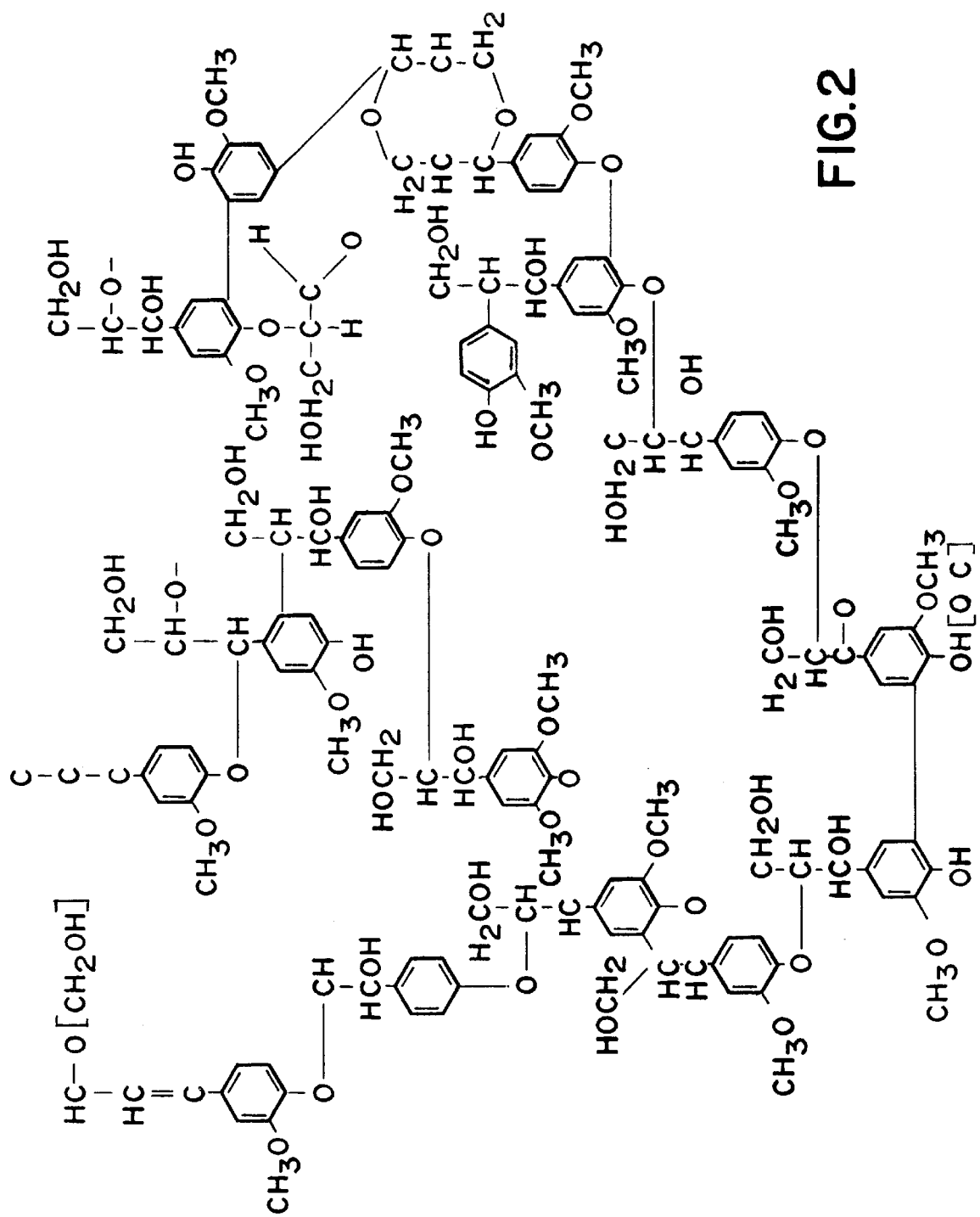
FIG. 2 is an example of a lignin polymer.
Figure 5:
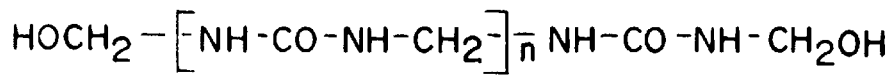
FIG. 5 shows specific example of the amino-aldehydes of FIG. 3.
Figure 5:
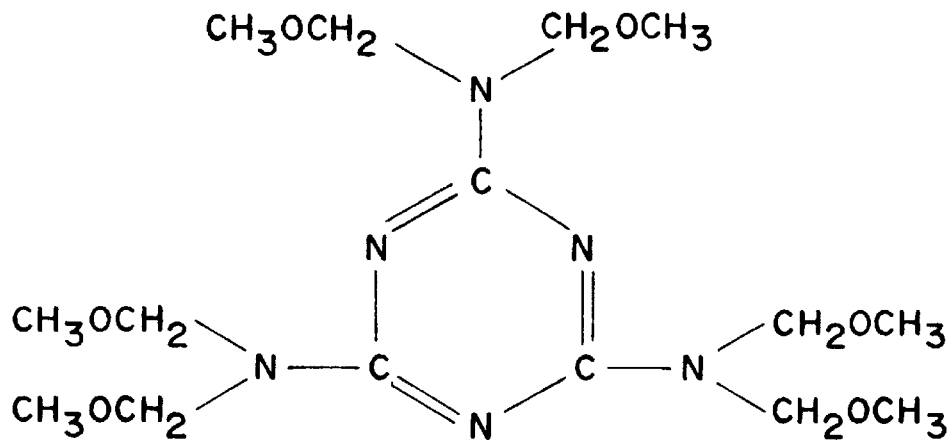
Figure 5:
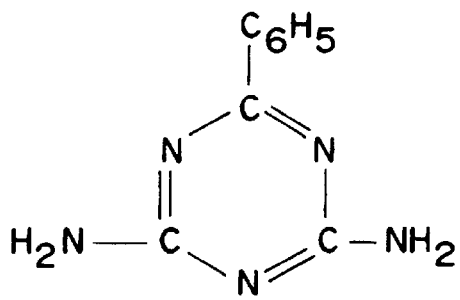
Figure 5:
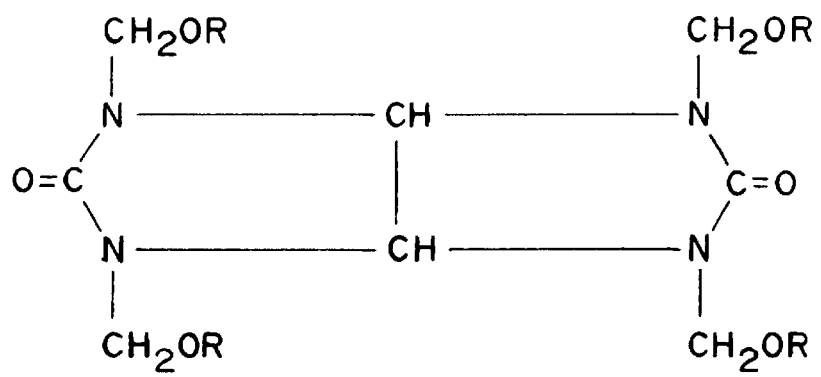

The currently used fossil fuel derived epoxy resins, would be replaced with resins derived from biobased renewable resources. Biobased materials are defined as polymers, or precursors, derived from renewable or biological sources by chemical or mechanical means. These materials include non-modified and chemically modified lignin (a component of wood and a by-product of paper manufacture), crop oils, wood resins, tannins, and polysaccharide resins that include, but are not limited to, cellulose and (commercially available) derivatives of cellulose and combinations of these materials. Due to the abundance, lower cost, and reduced energy requirements for producing these biobased materials, there should be potential cost advantages in the long term. It is desirable that these materials meet or exceed current PWB requirements for performance and reliability as shown below:

TABLE 1

Properties of FR-4 Epoxy/Glass Laminates

| | |
|---|---|
| Maximum Continuous Operating Temperature: | 130° C. |
| Coefficient of Thermal Expansion (CTE): | |
| lengthwise: | 100 ppm |
| crosswise: | 150 ppm |
| Water Absorption (24 hr immersion RT): | 0.5% |
| Flammability Rating (UL Class.): | 94 V–O |
| Flexural Strength (length./cross.): | 60/50 Kpsi |
| Copper Peel Strength (1 oz foil/ambient): | 8 lbs/in |
| Weight of Base Material (no metal cladding): | 5 oz/ft 2. |
| Dielectric Constant (1 Mhz ASTM D150): | 4.6 |
| Dissipation Factor (ASTM D150): | 0.018–0.02 |
| Dielectric Strength (ASTM 149): | 500 volts/mil |
| Dielectric Breakdown (ASTM D149): | 40 volts |
| Thermal Conductivity (base material, no copper): | 1.8 |

The underlying theme of the present invention is to substitute the resins and fibers currently used with bio-based materials. We seek to replace the synthetic resin matrix with renewable resinous materials. These materials may be chemically modified to introduce reactivity that will enable cross-linking and hardening, or be co-reacted with other compounds containing cross-linkable functional groups. Some examples (by no means complete or final) are lignin fractions from various sources combined with a naturally occurring or commercial epoxy or amino cross-linkers capable of co-reactions. Epoxidized crop oils can be added as needed, as reactive diluents or plasticizers. Materials of choice will be those which can be readily prepared in soluble liquid or semi-solid form which is most conducive to encasement around the fiber reinforcements using the currently available tooling and technology infrastructure for PWB fabrication. Additional biobased resin materials are modified celluloses or other polysaccharides.

These resins can be used with conventional glass or organic fiber reinforcements to verify that they have performance levels equivalent to the current epoxy resin based PWBs. Additionally, the glass fibers currently used could be replaced with bio-mass fibers, such as cellulose, jute, kenaf, ramie, flax, etc.

Issues such as fiber wettability by the resins, dimensional stability in dry and wet environments, non-flammability, and mechanical properties of the composite as required to meet the service needs of the PWB are factors in determining the optimized resin and fiber combination.

According to the present invention, biobased polymers having alcohol group, in particular phenol groups and aliphatic alcohol groups; and unsaturated carbon-carbon bonds are cross-linked through cross-linking agents.

Preferred biobased materials are lignin, crop oils, wood resins, tannin, polysaccharide resins, tannin and combinations thereof. The most preferred biobased polymer is lignin and lignin in combination with crop oils, wood resins, tannins, and polysaccharides.

According to the present invention, these bio-based polymers are cross-linked through polyfunctional cross-linking agents. A polyfunctional cross-linking agent has at least two sites which chemically interact with a reactive site on the bio-based material. Preferred cross-linking agents are polyfunctional epoxies and amino cross-linkers. Amino cross-linkers are molecules with a nitrogen atom with at least one aldehyde group bonded thereto. FIG. 3 shows an example of such a nitrogen atom wherein Q is the molecule, Z is H or an aldehyde group, wherein $R^1$ and $R^2$ are preferably H or an aliphatic group. FIG. 4 shows an aldehyde group wherein $R^1$ and $R^2$ are preferably H or an aliphatic group.

Investigations of biobased materials for use in the manufacture of an environmentally conscious, or "green" PC (printed circuit) board have produced a laminating resin using biobased or biodegradable materials, such as lignin (a by-product of paper manufacture), blended with certain commercially available epoxies. This resin has physical properties (such as glass transition temperature, coefficient of thermal expansion, thermal stability, and dielectric constant) that are similar to epoxy based boards known as FR4. Prepreg and laminates have been produced in the lab with a formulation that is>40%, preferably >50%, biobased. Alternate resin formulations (using higher functionality cross-linking agents, such as epoxies) have exhibited some properties that are superior to FR4 grade —which are suitable for advanced grade laminating resins.

In addition to meeting these needs, the bio-based materials can also be designed to be easily implemented in the current PWB manufacturing facilities. This will minimize additional tooling driven capital expenses and enable rapid commercialization production of these new PWBs.

If these composites, according to the present invention, are stripped of electrical components, ground up and subjected to microbial, bacteriological and fungal attack conditions found in a landfill or sewage treatment farms, biological reclamation may eventually take place. The option to separate the metallic content of the PWB waste before sending it to the landfill can be employed if economically warranted for reclamation. It is anticipated that these materials may be amenable to composting, thereby achieving biological recycling and eliminating incineration entirely. Even if landfill or composting is not an option and incineration is pursued, an environmental benefit can still be realized. The burning of renewable resources is neutral in terms of green house gas production since $CO_2$ from these resources is eventually recycled into the environment anyway. Energy is conserved directly because of the low energy requirements for the processing of wood based products, typically 5–10 million BTU/Ton compared to 30–90 million BTU/Ton for most plastics production. Therefore, dependence on finite fossil fuel resources, increasingly supplied from politically volatile foreign sources, is also lessened.

Most importantly, the use of bio-based materials will lead to direct cost benefits as well. Renewable materials, such as lignin, cellulose and polysaccharides, in unmodified form are in abundant supply. Cost effective strategies of chemical modification or blending with low cost non-renewable polymers to obtain the same properties for a bio-based PWB composite, should offer lower cost and more competitive pricing of U.S. made, FR-4 grade PWBs, in addition to providing environmental advantages.

Lignin is an aromatic biopolymer that is a by-product of the paper manufacturing industry, and it has been identified as a primary candidate for use in biobased epoxy formulations. In nature, lignin is an amorphous, polyphenolic material arising from an enzyme-mediated dehydrogenative polymerization of three phenylpropanoid monomers (FIG. 1)—coniferyl(a), sinapyl(b), and p-coumaryl(c) alcohols. Softwood lignin is comprised principally from coniferyl alcohol, while hardwood lignin is comprised of both coniferyl and sinapyl alcohol units in varying ratios. Grass lignins may contain all three types of alcohol units. The biosynthetic process, which consists essentially of radical coupling reactions, leads to the formation of a three-dimensional polymer that lacks the regular and ordered repeating units found in other natural polymers such as cellulose and proteins. For this reason, lignin is viewed not as a constitutionally defined compound, but as a composite of physically and chemically heterogeneous materials whose structure may be represented by models, such as shown in FIG. 2. Such a model should not be regarded as depicting the exact structural formula for lignin, but as a vehicle for illustrating the types of linkage modes of the constituent structural elements and the proportions in which they are believed to occur in lignin. The structural elements comprising lignin are linked by carbon-carbon and ether bonds. Units that are trifunctionally linked to adjacent units represent branching sites that give rise to the network structure characteristic of lignin.

During paper pulping, lignin is separated from the cellulose and other polysaccharides in plant tissues. Paper pulping processes utilize solvolysis of the ether linkages to degrade lignin, which lowers the molecular weight of the polymer and regenerates phenolic functional groups. Of the functional groups attached to the basic phenylpropanoid skeleton, those having the greatest impact on the reactivity of lignin include phenolic, hydroxyl, benzylic hydroxyl, and carbonyl groups. The frequency of these groups, as well as the molecular weight (MW), MW distribution, and residual contaminant levels will be dependent on the source of the lignin and on the pulping and isolation processes. Several methods have been used to remove lignin, including the alkaline based Kraft process, the solvent based Organosolv process, and the Steam Explosion process which is followed by either alkaline or solvent recovery of the degraded lignin.

Lignin isolated by Kraft, Organosolv, and Steam Explosion processes are useful to practice the present invention. Elemental analysis of commercially available samples of Kraft lignin from Westvaco, Charleston Heights, S.C. indicate that they contain 0.93% sodium, 0.14% potassium, 3.2% ash, and 1.9% sulfur (probably primarily bonded to the aromatic rings). The level of ionics in this sample is undesirable for electronic applications. We have reduced these levels through acidic/aqueous washes and extraction with water. Repeated washing of Kraft lignin has produced samples with sodium and potassium levels of around 200 ppm, as well as moderately reducing ash and sulfur levels to 1.3% and 1.4%, respectively. A sample of Kraft lignin was extracted for one week in a Soxhlet extractor, after which the extracted lignin and extraction residue were analyzed. The extracted lignin had significantly lower levels of sodium (50 ppm), potassium (33 ppm) and a somewhat lower level of sulfur (1.14%), while the levels of all of these elements increased in the extraction residue, indicating that thorough water washing should be sufficient to reduce the levels of unwanted ionics to acceptable levels. The weight average MW of the commercial Kraft lignin samples was measured by gel permeation chromatography to be 6,000, with a polydispersity of 4.4.

Organosolv lignin was acquired from Aldrich and Repap, Inc., Valley Forge, Pa. The Organosolv process utilizes organic solvents at high temperature and pressure to solvate the lignin. Organosolv lignin is therefore much lower in ionic and sulfur content. The analysis of the Organosolv sample indicated low levels of sodium (83 ppm), potassium (39 ppm), and sulfur (<0.15%) as received. The molecular weight of this material was lower, with a weight average molecular weight of 2,700 and a polydispersity of 2.6.

A sample of steam exploded lignin, obtained from Stake Technologies, from Norval, Ontario, Canada, was recovered under alkaline conditions. The lignin, as received, contained 1.1% sodium and 0.7% potassium. After repeated washing, these levels were reduced to 300–500 ppm. The steam exploded lignin had the highest molecular weight, with a weight average MW of 23,000 and a polydispersity of 11.

In addition to elemental analysis, infrared spectra of Kraft and Organosolv lignin have been taken. These spectra indicate that the Kraft lignin is derived from softwood trees (as expected for lignin from paper pulp sources), but that the Organosolv lignin is derived from hardwood trees. Lignin from softwood is composed almost entirely of polymers of coniferyl alcohol, while hardwood lignin has a mixture of coniferyl and sinapyl alcohol monomer residues. Further analysis and formulation with these materials will allow determination as to which lignin is optimal for our applications.

Crop oils are a bio-renewable source of mono- and multiunsaturated (primarily straight chain, C16–C22) fatty acids. The crop oils of primary interest for this application are those containing high levels of multiunsaturated fatty acids which can be easily epoxidized. Commercially available epoxidized vegetable oils, such as soybean, linseed, and tung oil, serve as both stabilizers and plasticizers in a variety of commercial polymer formulations. Epoxidized crop oils may be incorporated as reactive diluents to adjust the viscosity and flow properties of the resin formulation during casting and lamination, or as plasticizers.

The phenolic, hydroxyl, and carbonyl functional groups on lignin can be reacted with epoxy or amino-aldehyde crosslinkers. Amino-aldehyde cross-linking compounds are defined as monomeric, oligomeric, or polymeric resinous substances (either solid or liquid) which are formed by the reaction of amines or amides with aldehydes (usually formaldehyde). The commercially available materials is amino-aldehydes, urea-formaldehyde, melamine-formaldehyde, glycouril-formaldehyde and benzoguanamine-formaldehyde polymers (see FIG. 4). Amino crosslinkers are used to form thermoset coatings, usually through co-reaction (i.e cross linking) with hydroxyl, carboxyl or amino/amide functional molecules, and/or through self condensation (see FIG. 12).

Transehyerification of the cross-linking agent with the hydroxyl group on the biobased polymer, such as an alcohol group, for example, a phenolic group is shown in FIG. 12, wherein V is the biobased polymer and Q is the aminoaldehyde and $R^3$ is H and alkyl. FIG. 13 shows esterification of a cross-linker formation, wherein a carboxylic acid, wherein V, Q and $R_3$ are the same as on FIG. 12. The lignin molecule is capable of reacting with any amino cross-linker to form a laminating resin.

The thermal and electrical properties of a material are important to its applicability in circuit board technology. We have formulated lignin with diglycidyl ether of bisphenol A (DGEBA) and benzyldimethylamine (BDMA) as the initiator. The thermal properties of these formulations varied with composition, so a study of composition vs glass transition temperature (Tg), coefficient of thermal expansion (CTE), and thermal degradation was performed. Both Kraft and Organosolv lignins were included in this study. Compositions with lignin and DGEBA with lignin concentrations varying from 20–80% of the total solids content were included. The results of the Tg evaluations indicated that the highest glass transitions could be obtained with resins formulated with lignin concentrations of between 50–60%. The glass transition temperature decreased for formulations both above and below this range. The highest Tg observed was 147° C. from a formulation with 56% Kraft lignin, 44% DGEBA, and 0.4% BDMA. For comparison, a sample of FR-4 resin exhibited a Tg of 135° C. In general, Tg was slightly lower for the formulations with Organosolv lignin.

The thermal degradation of these formulations was evaluated at temperatures up to 300° C. The weight loss was consistent for samples with weight ratios of lignin/DGEBA from 0.5–1.5, but increased rapidly above and below this range. The weight loss within this range was similar for the various materials /formulations, averaging around 1% weight loss at 250° C. and about 3% loss at 300 C. This compares favorably with a test sample of FR-4 which exhibited a weight loss of 1.2% at 250° C. and 38% at 300° C. The materials/formulation had minimal impact on the CTE, which was 50–70 um/m° C. below Tg (compared to about 65 for FR-4 in the z-direction) and 180–210 um/m° C. above Tg (compared to 250–300 for FR-4) for all formulations.

A critical parameter of any potential FR4 replacement is the material's dielectric constant. The dielectric constant of resin discs with various compositions were measured. Formulations using Kraft lignin and DGEBA with 20–50% lignin had dielectric constants of 4.14–4.05. Resins formulated with Organosolv lignin and DGEBA with 50–66% lignin had dielectric constants of about 3.7. Dielectric constants for FR-4 laminates are between 4–5.

A variety of catalysts or initiators may be used to cure epoxy systems. The initiators are preferably tertiary amines, for example benzyldimethylamine (BDMA), tetramethylbutane diamine (TMBDA), and 2-methyl imidazole (2MI). Tertiary amines tend to increase the rate of phenol/epoxy reactions over aliphatic alcoho/epoxy reactions. A variety of natural products containing amines may also function as catalysts including caffeine, guanine, and folic acid.

In order to form 'prepreg' and laminate cores (from multiple sheets of prepreg) it is necessary to provide for an intermediate 'cured' state- commonly referred to as 'B' stage. During the laminate core formation state, usually the final laminating step—the resin is advanced from the 'B' stage to the completely cured material or 'C' stage. This 2 stage curing process is easily accomplished with epoxy or amino crosslinkers combined with lignin by adjusting the type and amount of cross-linker and the type and amount of specific catalyst to raise or lower the curing temperatures. The epoxy and amino crosslinkers are also soluble in typical 'prepreg' solvents, such as acetone, alcohols and other higher ketones.

The preferred formulation that yielded the highest glass transition temperature (56% Kraft lignin, 44% DGEBA, 0.4% BDMA) was used to form a prepreg on 106 glass cloth using a hand treater tower. A preferred solution that was 52% solids in a methyl ethyl ketone/ethanol (1/1) solvent system was applied to the cloth and received a 5 min., 150° C. B-stage bake. This resulted in a 3 mil thick, flexible, tack free prepreg. Infrared spectra indicate an almost 50% reduction in the height of the epoxy peak, indicating an acceptable extent of reaction during B-staging. Samples of this prepreg were laminated in a vacuum lamination press both with and without 1 oz. copper cladding. The preferred lamination conditions were chosen to be similar to those currently used for FR-4; 450–500 psi, 180–185° C., 70 min. cure time under vacuum. These prepreg samples laminated well without excessive flow, producing tough, flexible laminates with good copper adhesion. A sample of the copper clad prepreg laminate was patterned (using Riston) and etched to produced 5 mm peel strips. Ninety degree peel tests on an Imass Slip/Peel Tester indicated an average peel strength of 8 lb/in, which meets the standard IPC requirement for peel strength.

Exposure of the laminate to the copper etching solutions did not appear to have any adverse effects. Dielectric measurements of the laminate are also in progress. The glass transition temperature of the unclad laminate was measured at 130–134° C.

The glass transition temperature of a resin affects the dimensional stability of the laminate. In general, the use of higher functionality epoxy resins will produce increased cross-linking, higher Tg, improved dimensional stability, and improved moisture resistance. DGEBA has a functionality of 2, but many epoxy novolac resins have higher functionality. Anticipating the need for more advanced applications we have also formulated laminating resins with mixtures of lignin and epoxy novolacs, including Dow's D.E.N. 431 (ave. functionality=2.2), 438 (ave. funct.=3.6) and 439 (ave. funct.=3.8), and Ciba Geigy's epoxy cresol novolacs ECN 1273 (ave. funct.=4.8), 1280 (ave. funct. =5.1) and 1299 (ave. funct.=5.4) using 55% lignin, 45% epoxy resin, and 0.4% initiator. The Tg of the pure resins after cure (2 hr/150° C.) do show improvement over the lignin/DGEBA formulations, with Tg's of 153° C., 158° C., 161° C., 173° C., 172° C., and 176° C. respectively.

The properties of the cross-linked biobased material according to the present invention, can be modified by adding additives to the material, such as particles, rods, fibers and cloths. To enhance the thermal conductivity, thermally conductive particles can be added. To modify the dielectric constant, dielectric particles can be added. To enhance the strength particles, in particular elongated particles such as fibers, rods, or fabrics, can be added.

Figure 6:
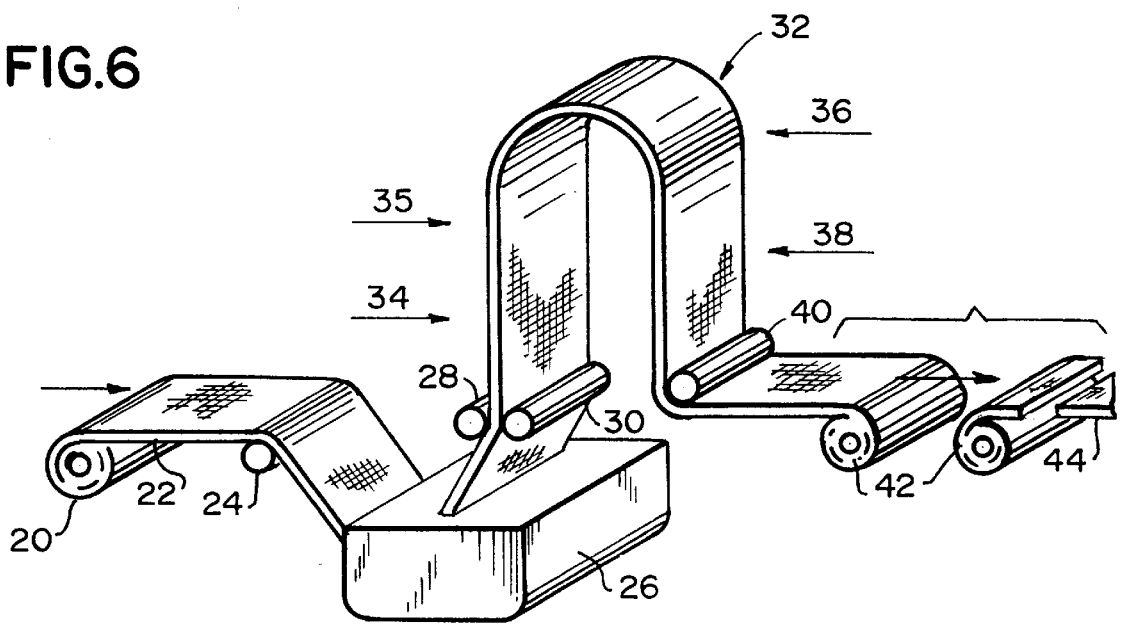
FIG. 6 schematically shows a process to form a prepeg.

FIGS. 6 to 11 show a process to fabricate printed circuit boards according to the present invention. FIG. 6 shows the formation of a prepeg. Roller 20 has fabric 22 wound thereon. The fabric 22 is fed over roller 24 into resin tank 26 where the fabric is saturated with resin. The saturated cloth is fed through squeeze rollers 28 and 30 to remove excess resin. The saturated cloth is fed up a treater tower 32 where it is exposed to energy, preferably heat or electromagnetic radiation, at a number of stages, for example, stages 34, 35, 36 and 38 to partially cure (cross-link) the resin impregnated cloth to which a tack free condition (prepeg) is directed by roller 40 for rewinding onto roller 42. The prepeg is unwound from roller 42 and cut into sheets 44.

Figure 7:
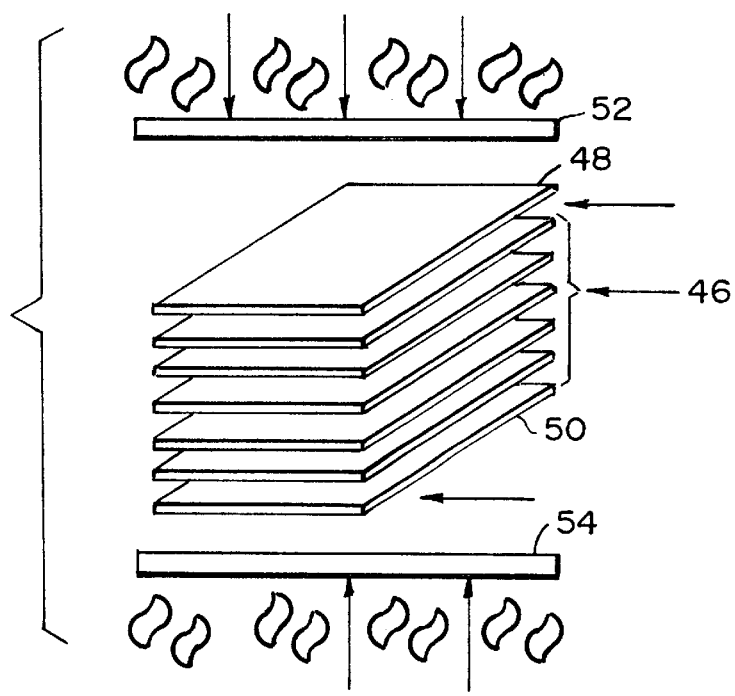
FIG. 7 schematically shows a process to form a laminate from a prepeg.

Referring to FIG. 7, a number of prepeg sheets 46 are stacked with copper foil 48 and 50 on the outside of the stack. The combined stack is pressed by platens 52 and 54 while energy, preferably heat or electromagnetic radiation is applied to fully cure or cross-link the resin to form a laminate.

Figure 8:
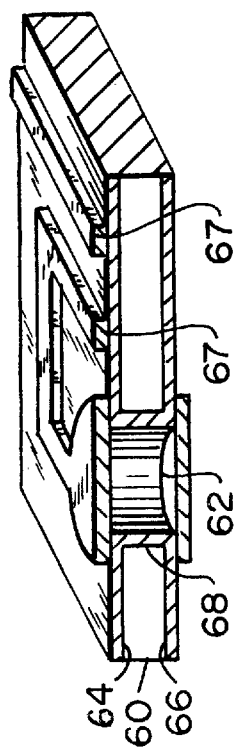
FIGS. 8–9 show a PWB formed by a substractive etch process.
Figure 9:
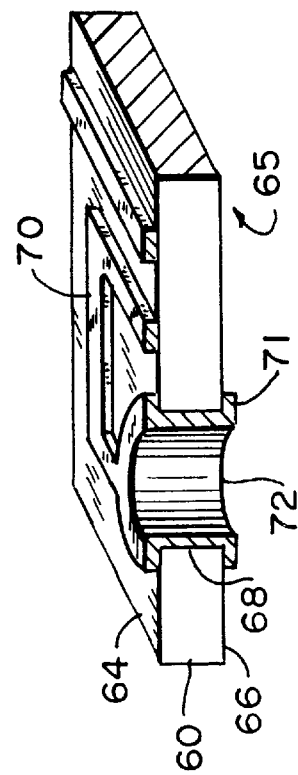

FIGS. 8 and 9 show a subtractive etch process to form a PWB. FIG. 8 shows laminate 60 which has a through-hole 62 drilled from surface 64 to 66. The laminate surfaces 64 and 66 and through-hole sidewall 68 are coated with a thin metal by conventional seading and electroless or electrolytic plating. A patternable resist 67, preferably a photoresist, is disposed on the metal layer which is substractively etched to produce electrically conductive pattern 70 on surface 64, 72 on through-hole sidewall 68, and 71 on surface 66 to form PWB 65. Metal 72 on through-hole sidewall 68 electrically interconnects patterns 70 and 71.

Figure 10:
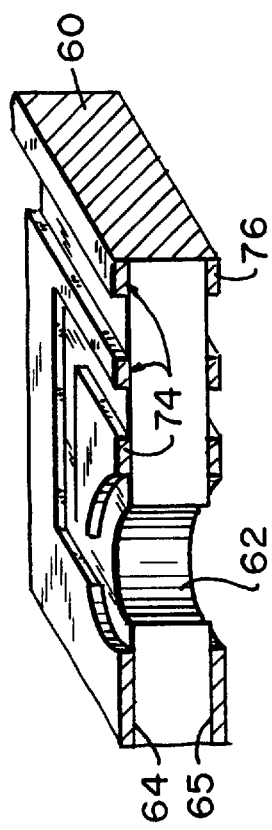
FIGS. 10–11 show a PWB formed by an additive process.
Figure 11:
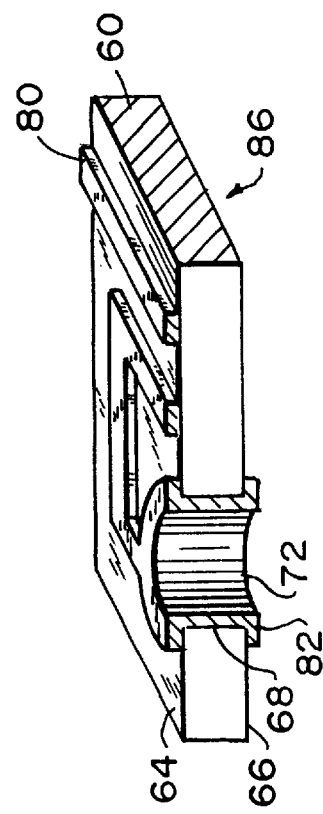

FIGS. 10 and 11 show an additive etch process for forming a PWB. Reference numbers common between FIGS. 8–11 represent the same thing. Patterned resist 74 and 76 are disposed on surface 64 and 66, respectively, of laminate 60 with through-hole 62 formed therein. Metal, preferably copper, is electrolitically or electrolessly plated onto those parts of surface 64 and 66 exposed through the resist pattern to form electrically conducting patterns 80 and 82 on surfaces 64 and 66, respectively. The metal 86 on through-hole sidewall 68 electrically interconnects patterns 80 and 82 to form PWB 86.

The PWB 86 and 75 can be stacked to form a multilayer PWB. An electronic device such as silicon chip can be mounted in electrical connection with the PWB 86 and 65.

While the present invention has been described with respect to preferred embodiments, numerous modifications, changes, and improvements will occur to those skilled in the art without departing from the spirit and scope of the invention.

What is claimed is:

1. A method of preparing a cross-linked polymer composition for use in a printed circuit board composing the steps of:
   forming an admixture having not less than 50% by weight of a polymer selected from the group consisting of lignin, crop oils, wood resins, tannins, polysaccharide resins, and combinations thereof;
   an epoxy resin cross-linking agent selected from the group consisting of diglycidyl ether benzylamine, epoxy novolacs epoxy cresol novolacs;
   an initiator selected from the group consisting of benyldimethylamine tetamethylbutane diamine, 2-methyl imidazole, caffeine, guanine and folic acid;
   adding energy selected from the group consisting of heat and electroergetic radiation to cause cross linking.

2. The method of preparing the cross-linked polymer composition for use in a printed circuit board as defined in claim 1 wherein said composition also contains compounds comprising the reaction products of amines or amides and formaldehydes and selected from the group selected of amino aldehydes, urea-formaldehyde, melamine formaldehyde, glycouril-formaldehyde, benoguanamine-formaldehyde polymers.

3. The method of preparing the cross-linked polymer composition for use in a printed circuit board as defined in claim 2 wherein said composition contains additives selected from the group consisting of particles, rods, fibers and cloths.

4. The method of preparing the cross-linked polymer composition for use in a printed circuit board as defined in claim 2 wherein said admixture has between about 50% and 60% by weight of said polymer.

5. The method of preparing the cross-linked polymer composition for use in a printed circuit board as defined in claim 4 wherein said composition contains conventional glass reinforcements, organic fiber reinforcements, cellulose fiber reinforcements, jute fiber reinforcements, kenaf fiber reinforcements, ramie fiber reinforcements, flax reinforcements.

* * * * *